United States Patent
You et al.

(10) Patent No.: US 11,815,565 B2
(45) Date of Patent: Nov. 14, 2023

(54) SYSTEM FOR PERCEIVING OPERATING STATE OF LARGE POWER TRANSFORMER BASED ON VIBRO-ACOUSTIC INTEGRATION

(71) Applicants: STATE GRID XINJIANG CO., LTD. ELECTRIC POWER RESEARCH INSTITUTE, Xinjiang (CN); Nanjing Unitech Electric Power Co., Ltd., Jiangsu (CN); State Grid Corporation of China, Beijing (CN)

(72) Inventors: Yi You, Xinjiang (CN); Ling Zhang, Xinjiang (CN); Kaike Wang, Xinjiang (CN); Cheng He, Xinjiang (CN); Puzhi Zhao, Xinjiang (CN); Ronggang Gao, Xinjiang (CN); Jianping Zhao, Xinjiang (CN); Xinxin Wang, Xinjiang (CN); Xianfu Liu, Jiangsu (CN)

(73) Assignees: STATE GRID XINJIANG CO., LTD. ELECTRIC POWER RESEARCH INSTITUTE, Urumqi (CN); Nanjing Unitech Electric Power Co., Ltd., Nanjing (CN); State Grid Corporation of China, Beijing (CN)

( * ) Notice: Subject to any disclaimer, the term of this patent is extended or adjusted under 35 U.S.C. 154(b) by 138 days.

(21) Appl. No.: 17/616,310

(22) PCT Filed: Oct. 8, 2021

(86) PCT No.: PCT/CN2021/122594
§ 371 (c)(1),
(2) Date: Dec. 3, 2021

(87) PCT Pub. No.: WO2022/100323
PCT Pub. Date: May 19, 2022

(65) Prior Publication Data
US 2022/0349957 A1 Nov. 3, 2022

(30) Foreign Application Priority Data

Nov. 10, 2020 (CN) .......................... 202011249532.0

(51) Int. Cl.
*G01R 31/62* (2020.01)

(52) U.S. Cl.
CPC .................................. *G01R 31/62* (2020.01)

(58) Field of Classification Search
CPC .............. G01R 31/62; G01R 31/1227; G01R 31/3272; G01R 15/12; G01R 15/181;
(Continued)

(56) References Cited

FOREIGN PATENT DOCUMENTS

| CN | 210041332 A | * | 2/2002 | ............. H02J 13/00 |
| CN | 107748314 A | * | 3/2018 | ............. G01R 31/72 |

(Continued)

OTHER PUBLICATIONS

English transation of Chen et al. CN107748314-A (Year: 2017).*
(Continued)

*Primary Examiner* — Jermele M Hollington
*Assistant Examiner* — Courtney G McDonnough

(57) ABSTRACT

The present disclosure provides a system for perceiving an operating state of a large power transformer based on vibro-acoustic integration, including a perception layer, a network layer, and a diagnostic layer, where the perception layer is used for monitoring, in real time, a state parameter for a coupling vibration signal and an acoustic signal of each of a transformer core, a winding, a clamp and a housing, a state parameter of each of a vibration signal and an acoustic signal during a gear position change of an on-load tap changer (OLTC), and preliminarily diagnosing and analyzing monitored data. The system can monitor the operating state of the OLTC online for a long time, flexibly configure the sensor channel and the sensor type according to different (Continued)

application requirements, automatically acquire and identify the gear position change, and correctly identify and process a gear position corresponding to the monitoring signal.

6 Claims, 5 Drawing Sheets

(58) Field of Classification Search
CPC ...... G01R 19/00; G01R 19/165; G01R 21/00; G01R 21/06; G01R 22/06; G01R 23/02; G01R 31/08; G01R 31/1281; G01R 31/66; G01R 33/02
USPC ........................................................ 324/547
See application file for complete search history.

(56) References Cited

FOREIGN PATENT DOCUMENTS

| | | | | |
|---|---|---|---|---|
| CN | 107748314 A | | 3/2018 | |
| CN | 109856501 A | * | 6/2019 | ............. G01R 31/06 |

OTHER PUBLICATIONS

English transation of Luo et al CN 109856501 (Year: 2019).*
English transation of Li et al. CN 210041332-A On-load Voltage Regulation Device Based on LORA (Year: 2002).*

* cited by examiner

SYSTEM FOR PERCEIVING OPERATING STATE OF LARGE POWER TRANSFORMER BASED ON VIBRO-ACOUSTIC INTEGRATION

TECHNICAL FIELD

The present disclosure relates to the field of transformers, and in particular, to a system for perceiving an operating state of a large power transformer based on vibro-acoustic integration.

BACKGROUND

According to the Outline of National Medium- and Long-Term Program for Science and Technology Development (2006-2020), "Super large-scale electric power transmission and distribution and power grid safeguards" are listed as main areas and priority topics. During acoustic detection of main devices in power grids, vibration characteristics of the devices can be obtained without power interruption. Voiceprint characteristics of the devices in different operating conditions and defects, which are excavated by analyzing acoustic fingerprints of the devices with big data, artificial intelligence (AI), and other analysis algorithms, can effectively manifest mechanical characteristics of the devices, and this is one important method for determining states of the devices.

In recent years, the transformers always present different damages and latent faults due to the long-time operation, despite constant optimization of the manufacturing process and flow. With overload operation and large short-circuit currents of power transformers, important components such as cores and windings in the transformers are greatly impacted by the huge electromagnetic force, thereby weakening the mechanical strength. Though no sudden faults are indicated, this case will result in some major faults inevitably with the cumulation of the damage as well as the insulation, aging, and deterioration of some components. Hence for a long time, the electric power department regularly conducts the interruption maintenance on the transformers according to requirements in *Preventive Test Code for Electric Power Equipment*, in an attempt to ensure the safe operation of power systems, and find and remove some early latent faults. Undoubtedly, the mechanism is quite helpful to prevent the faults of the transformers and ensure the reliable operation of the transformers. However, the interruption maintenance mechanism often follows the specified maintenance cycles in regulations, and related test items must be conducted on the transformers upon arrival of the maintenance time. There is great blindness due to no consideration on the present operating states of the devices and a great waste of human and financial resources due to some complex test items and the power interruption. Moreover, the long-term maintenance on a healthy transformer will affect the stability of the system to a great extent; and consequently, the devices may be damaged earlier and the prevented faults may occur earlier.

The manufacturing quality, operation, and maintenance level of an on-load tap changer (OLTC) are directly associated with the safe operation of an on-load tap changing transformer. With the increasing use of the on-load tap changing transformer in power grids, faults of the OLTCs are also rising. It is statistically revealed that accidents and faults in OLTCs respectively account for 18% and 12% among nationwide accidents and faults of 110-500 kV transformers, and there are 25% of faults in the OLTCs among all faults of the 500 kV transformers. According to foreign statistical data, there are 41% of faults in the OLTCs among all faults of the on-load tap changing transformers. The existing fault rate of the OLTCs remains stubbornly high with an upward trend. Domestic average statistical data reveal that there are more than 20% of faults in the OLTCs among all faults of the transformers.

Furthermore, according to the "two sessions" in 2019, the strategic goals of promoting the construction of "three types and two networks" in an all-round way and accelerating to construct the globally competitive and world-class energy Internet enterprises are the concrete practices in companies under the strategies of network powers, the important measures to implement deployments of the Central Government and exert the leading roles of central enterprises, and the inevitable requirements to adapt to situations and challenges in home and abroad. The construction of a ubiquitous electric Internet of Things (UEIOT) will create a new way for safer operation, more exquisite management, more accurate investment and more excellent service of the power grids; and meanwhile, unique advantages of the power grids can also be fully used to create a huge blue ocean market for the digital economy. The construction of the UEIOT is a key to implement the strategic goal of the "three types and two networks".

Due to the reliance of society on electricity, higher requirements are imposed on the reliability of the power supply. With the increasingly complicated power grids and the mounting types and quantities of access devices, forms of the power grids have been changed, and the safe operation of the power grids is becoming more pressured. Under the influences of factors such as the open power market, the reduced transmission-distribution price, and the slowdown in power generation growth, power services are facing the increasingly fierce market competition and the operation of the power grid enterprises is getting tough. In response to the change of the Internet economy, digital economy, and other social-economic formations, docking the suppliers and the customers through platforms to create multi-sided markets presents great challenges for the power industry.

SUMMARY

A technical problem to be solved by the present disclosure is to monitor an operating state of the OLTC for a long time, flexibly configure the sensor channel and the sensor type according to different application requirements, automatically acquire and identify the gear position change, and correctly identify and process a gear position corresponding to the monitoring signal.

The present disclosure is implemented through the following technical solutions: A system for perceiving an operating state of a large power transformer based on vibro-acoustic integration includes a perception layer, a network layer, and a diagnostic layer, where the perception layer is used for monitoring, in real time, a state parameter for a coupling vibration signal and an acoustic signal of each of a transformer core, a winding, a clamp, and a housing, a state parameter of each of a vibration signal and an acoustic signal during a gear position change of an OLTC, and preliminarily diagnosing and analyzing monitored data;

the network layer is used for reliably transmitting a monitoring signal to a background; and the diagnostic layer is used for managing basic information of a tested OLTC device; configuring a parameter for analysis of the perception layer; receiving the monitored data from the perception layer; analyzing and displaying a monitoring state and an advanced intelligent analysis result of the tested device in real time; performing fault data analysis, original graph analysis, envelope analysis, and energy spectrum analysis on the specific monitored data; generating and managing a case library; generating and managing a standard library; generating a report; receiving and managing basic device information and a tested device state from a data access node; alarming for an abnormal state and prompting a user; and counting and analyzing a fault gear position distribution, a fault type distribution and the like for the tested device state.

As a preferable technical solution, the perception layer may be provided with two perception terminals, used for respectively acquiring a vibration signal and a voiceprint signal, and wirelessly transmitting the vibration signal and the voiceprint signal to a centralized control unit, a sensor, a data acquisition plate, a wireless module, and a battery being integrated into each of the perception terminals, where a microprocessor control unit (MCU) module as a master control chip is used for configuring a sensor unit and a communication unit, acquiring and processing information of the sensor, and sending the information to the communication unit; the sensor unit is used for perceiving and acquiring environmental information; the communication unit is used for receiving and modulating a signal from the MCU or demodulating a signal from an antenna; the antenna is used for transmitting and receiving a signal; a vibro-acoustic signal passes through a micropower crystal amplifier from the sensor to an ultra-low-power voltage comparator; and when the vibro-acoustic signal reaches a limit value, a field effect transistor (FET) is activated.

As a preferable technical solution, upon reception of a command from a sink node, the perception terminals each may perform cyclic redundancy check (CRC)16 verification on data to ensure an accuracy of the data, execute a corresponding operation according to a frame command in a message, and then upload corresponding data information to a gateway.

As a preferable technical solution, the perception terminals each may further be provided with software; the perception terminals each may not only acquire data, but also upload and receive data and a command through a long range radio (LoRa) network; upon reception of a message from a centralized management center or a message uploaded by an acquisition node, a sink node may also perform CRC verification on message data to ensure an accuracy of the data, and determine, through a command in the message, whether the message is sent by a server or uploaded by the perception terminal; if the message is sent by the server, the sink node may determine, through a device number, whether the message is sent to itself or to the perception terminal; and if the message is uploaded by the perception terminal, and received data is correct through the CRC verification, the sink node may upload the data to the server.

As a preferable technical solution, the perception layer may further include a centralized control unit, used for implementing real-time and continuous online monitoring with an industrial control computer and a multi-path acquisition card.

As a preferable technical solution, the network layer may use LoRa communication to improve a communication reliability of a sensor and an intelligent level of the system.

As a preferable technical solution, the diagnostic layer may be provided at a substation server, and used for acquiring the monitored data and a preliminary analysis result from the perception layer.

The present disclosure has the following beneficial effects: The system can monitor the operating state of the OLTC online for a long time, flexibly configure the sensor channel and the sensor type according to different application requirements, automatically acquire and identify the gear position change, and correctly identify and process a gear position corresponding to the monitoring signal.

The edge computing system is used to calculate data locally, and the sink node and the access node respectively undertake different edge computing tasks, so the present disclosure can greatly improve the overall calculation and processing efficiency of the system.

With preliminary diagnosis and fine diagnosis, the present disclosure makes full use of multi-dimensional state data such as the voiceprint signal and the vibration signal to perform distributed, fusion, and intelligent calculation and analysis on the transformer, thereby giving the diagnosis and analysis results.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DETAILED DESCRIPTION

Figure 1:
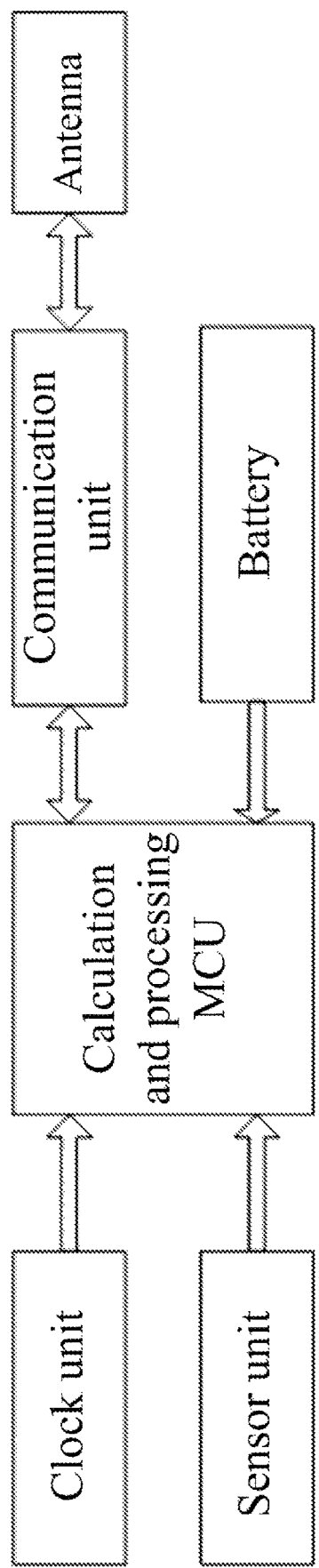
FIG. 1 is a schematic diagram of a perception terminal according to some embodiments of the present disclosure.

Except contradictory features and/or steps, all features, methods, or steps in processes which are disclosed in this specification can be combined in any manner.

Unless otherwise explicitly specified, any feature disclosed in this specification (including any added claim, abstract, and accompanying drawing) can be substituted by equivalent features or by features with similar purposes, that is, each feature is just an example of a series of equivalent or similar features.

In the description of the present disclosure, it should be understood that orientation or position relationships indicated by terms "one end", "the other end", "outside", "upper", "inside", "horizontal", "coaxial", "central", "end portion", "length", "outer end" and the like are orientation or position relationships as shown in the drawings, and these terms are just used to facilitate description of the present disclosure and simplify the description, but not to indicate or imply that the mentioned device or element must have a specific orientation and must be constructed and operated in a specific orientation, and thus, these terms cannot be understood as a limitation to the present disclosure.

In the description of the present disclosure, "a plurality of" means at least two, for example, two or three, unless otherwise clearly and specifically limited.

For ease of description, terms indicating spatial relative positions such as "on", "above", "under" and "below" may be used herein to describe the relationship of one unit or feature shown in the figures with another unit or feature. The terms indicating the spatial relative positions can be intended to include different orientations, other than the orientations shown in the figures, in use or work of the device. For example, turning over the device in the figure is described as that the unit "below" or "under" another unit or feature is located "above" said another unit or feature. Therefore, the exemplary term "below" may include both orientations "above" and "below". The device oriented in other ways (rotated by 90° or to another orientation) is correspondingly construed as the spatially associated description term used herein.

In the present disclosure, unless otherwise clearly specified and limited, meanings of terms "provided", "sleeved", "connected", "penetrating", "spliced" and the like should be understood in a broad sense. For example, the connection may be a fixed connection, a removable connection, or integration; may be a mechanical connection or an electrical connection; may be a direct connection or an indirect connection implemented by using an intermediate media; or may be intercommunication between two components or an interaction relationship between two components, unless otherwise clearly limited. Those of ordinary skill in the art may understand specific meanings of the above terms in the present disclosure based on a specific situation.

As shown in FIG. 1, a system for perceiving an operating state of a large power transformer based on vibro-acoustic integration includes a perception layer, a network layer, and a diagnostic layer.

(1) Perception Layer

Perception devices provided locally by the system for the transformer include a pressure perception terminal, a centralized control unit, etc.

1) Hardware Design of the Perception Terminals

As shown in FIG. 1, the system is provided with two perception terminals, used for respectively acquiring a vibration signal and a voiceprint signal, and wirelessly transmitting the vibration signal and the voiceprint signal to a centralized control unit, a sensor, a data acquisition plate, a wireless module and a battery being integrated into each of the perception terminals.

An MCU module as a master control chip is used for configuring a sensor unit and a communication unit, acquiring and processing information of the sensor, and sending the information to the communication unit; the sensor unit is used for perceiving and acquiring environmental information; the communication unit is used for receiving and modulating a signal from the MCU or demodulating a signal from an antenna; and the antenna is used for transmitting and receiving a signal. As fewer tasks are processed on the MCU, requirements on the basic frequency of the MCU are not particularly high. However, the MCU should be at least provided with enough general-purpose input/output (GPIO) pins and serial peripheral interfaces (SPIs) to ensure control and communication on wireless chips, and must further be provided with universal asynchronous receiver-transmitter (UART) interfaces to communicate with other devices. Requirements on technical indicators of the MCU chips are as shown in Table 1:

TABLE 1

| Parameter | Minimum value | Recommended value |
|---|---|---|
| Flash | 32K | 64K |
| RAM | 4K | 8K |
| SPI interface | Must | Must |
| UART interface | Must | Must |
| Number of requested pin of MCU terminal | 4 | 4 |
| Basic-frequency clock pulse | 36 MHz | 72 MHz |

The vibro-acoustic signal passes through a micropower crystal amplifier from the sensor to an ultra-low-power voltage comparator; and when the vibro-acoustic signal reaches a limit value, an FET is activated. The case where the vibro-acoustic signal reaches the limit value refers to that the vibration range is ±50 g, and the acoustic range is 30 dB (A)-124 dB (A). With the power consumption of only 6 MA, the whole circuit can be powered by the lithium button battery for five years.

Figure 2:
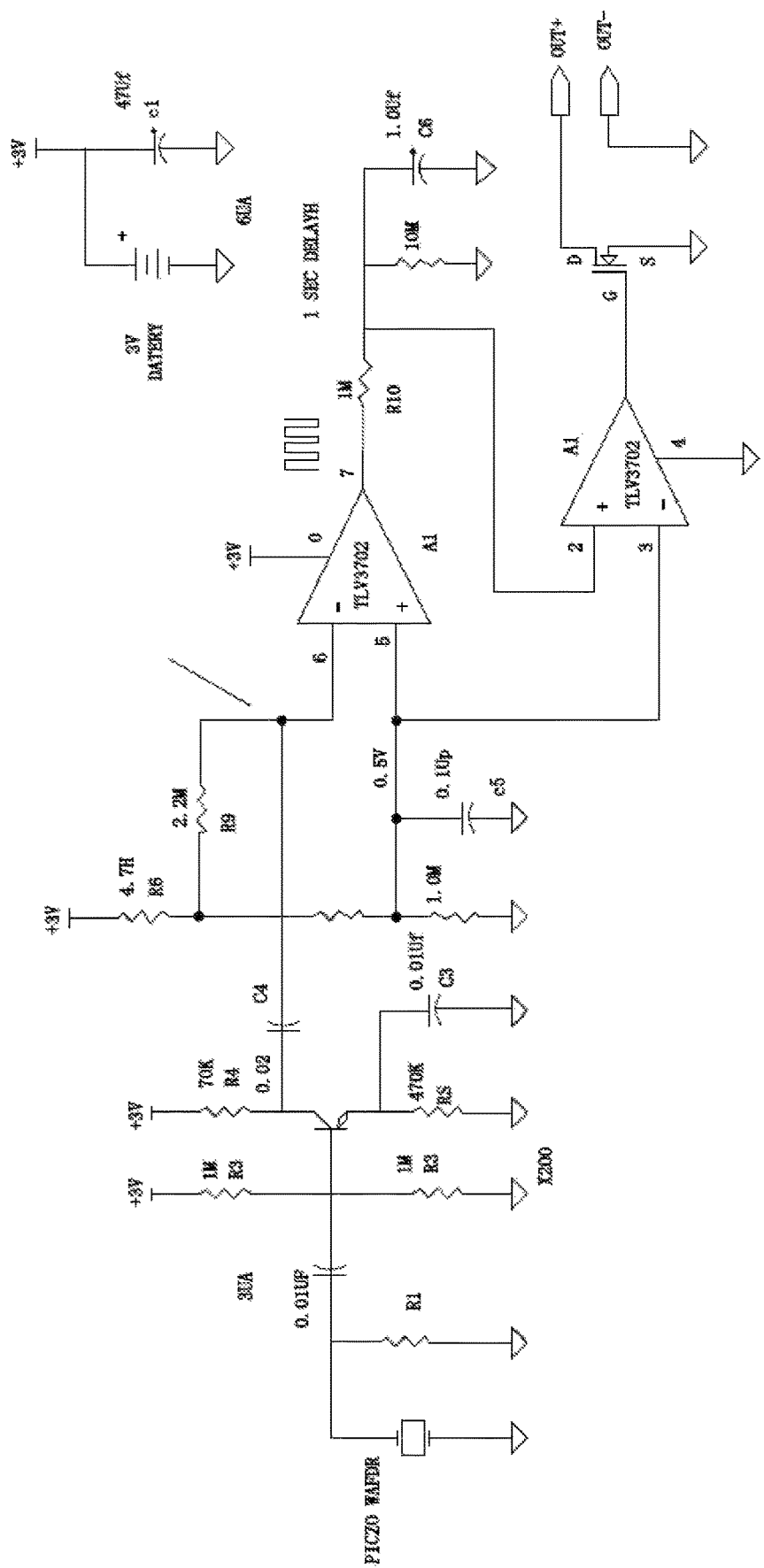
FIG. 2 is a circuit diagram of a perception terminal according to some embodiments of the present disclosure.

In FIG. 2, the single resistor R7 determines the vibration sensitivity, and the ultra-low noise can be filtered by selecting the resistance. An adjustable delay filter is further provided behind the voltage comparator circuit. When detecting the vibration signal, the circuit can output a positive signal to serve as a working state or an alarm.

2) Ad-Hoc Gateway

Figure 3:
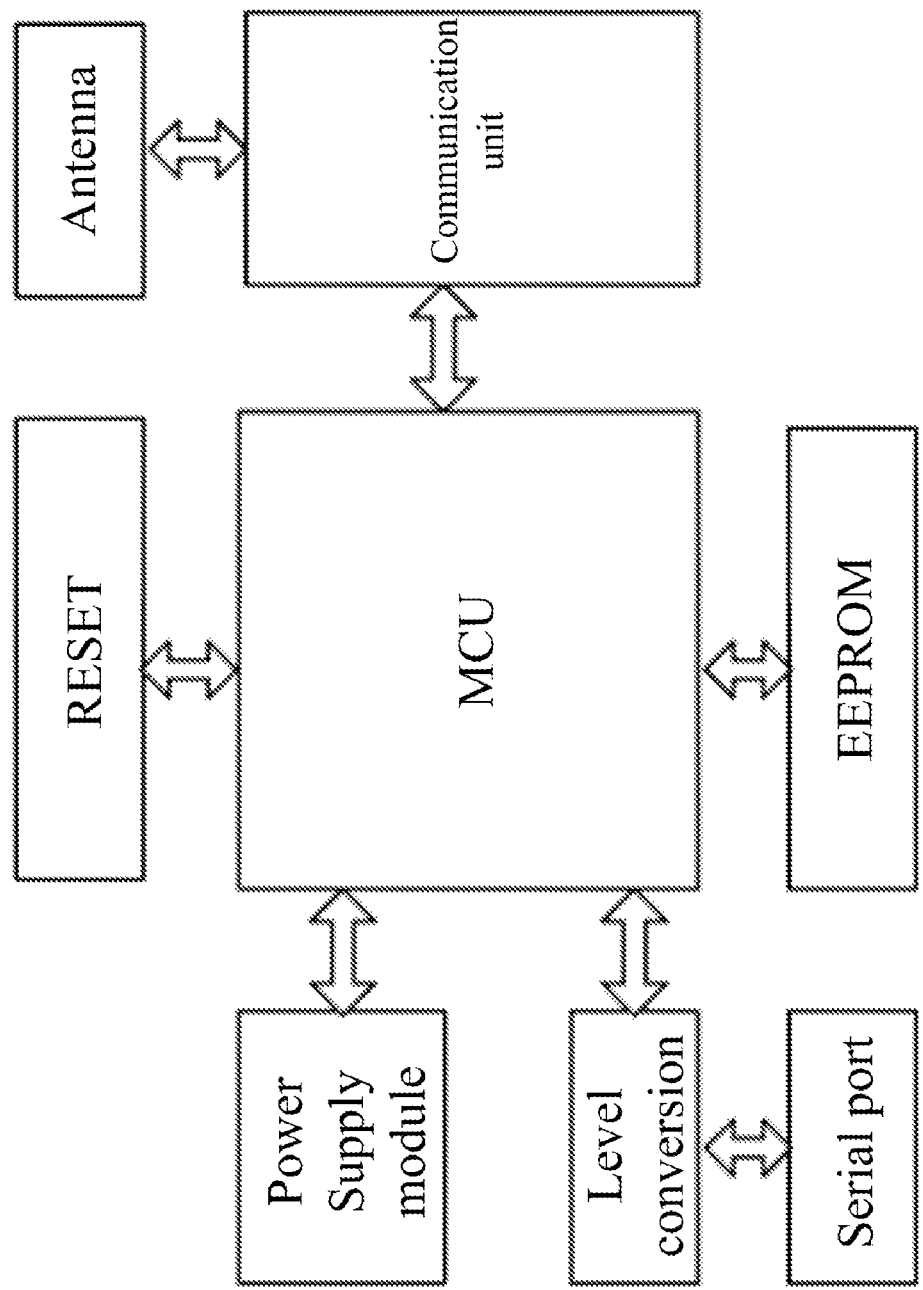
FIG. 3 is a schematic diagram of an ad-hoc gateway according to some embodiments of the present disclosure.

As shown in FIG. 3, as a core of the whole wireless communication network, the gateway connects terminal nodes in the system to form a wireless local area network (WLAN), thereby implementing the networking operation for multiple terminal nodes. Meanwhile, the gateway also serves as a coordinator and a controller of the whole system to coordinate the communications of all terminal nodes and control the life cycles of the terminals in the network. There are further an MCU, a wireless transceiver module, a memory and a power supply management. The gateway is mainly used for receiving data information from the terminal, and forwarding the data information to the server.

3) Software Design of the Perception Terminals

Figure 4:
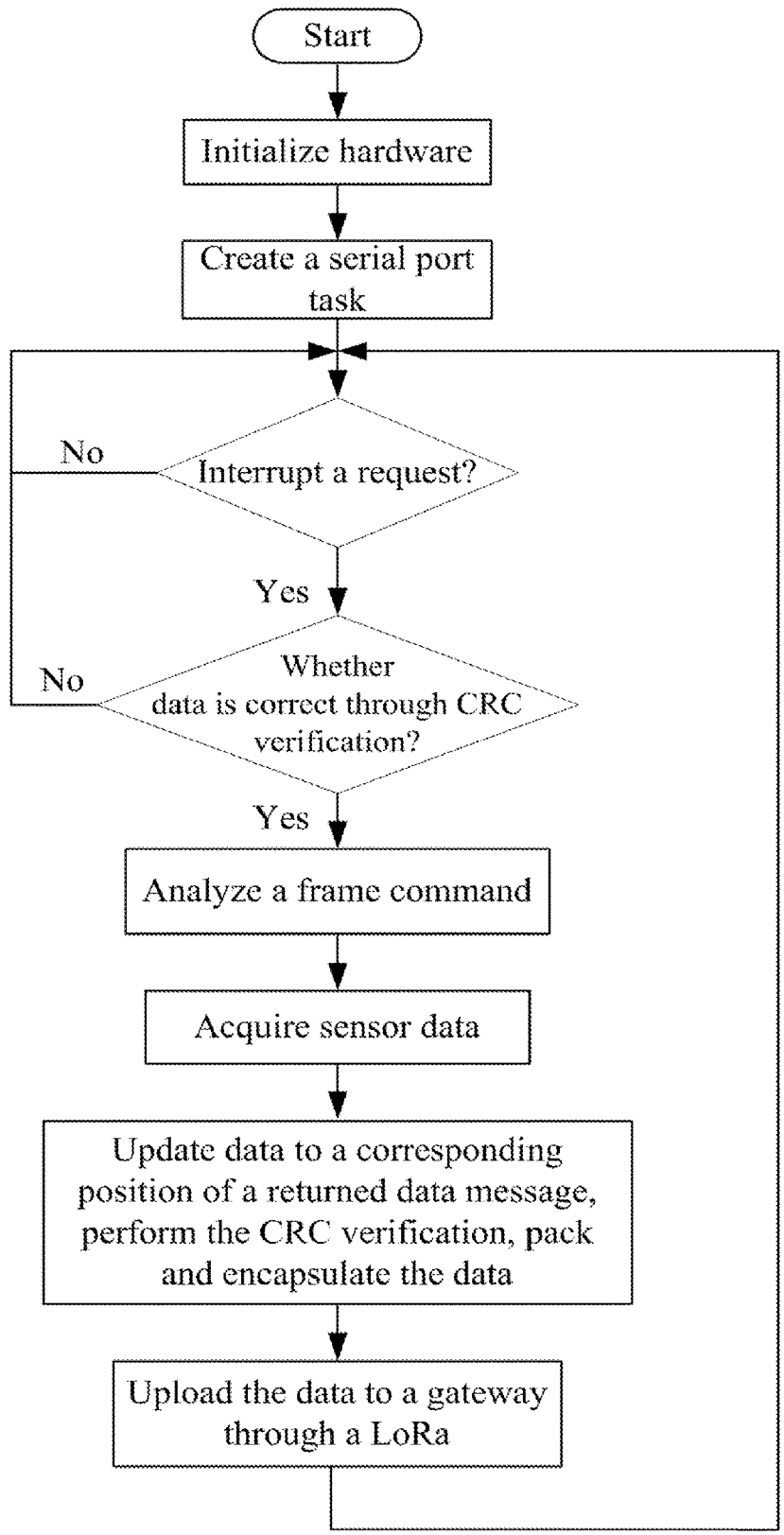
FIG. 4 is a work flow chart of software of a perception terminal according to some embodiments of the present disclosure.

The perception terminals each not only acquire data, but also upload and receive data and a command through a LoRa network. Upon reception of a command from a sink node, the perception terminals each perform CRC16 verification on data to ensure an accuracy of the data, execute a corresponding operation according to a frame command in a message, and then upload corresponding data information to the gateway. The work flow chart of software in each of the perception terminals is as shown in FIG. 4.

Figure 5:
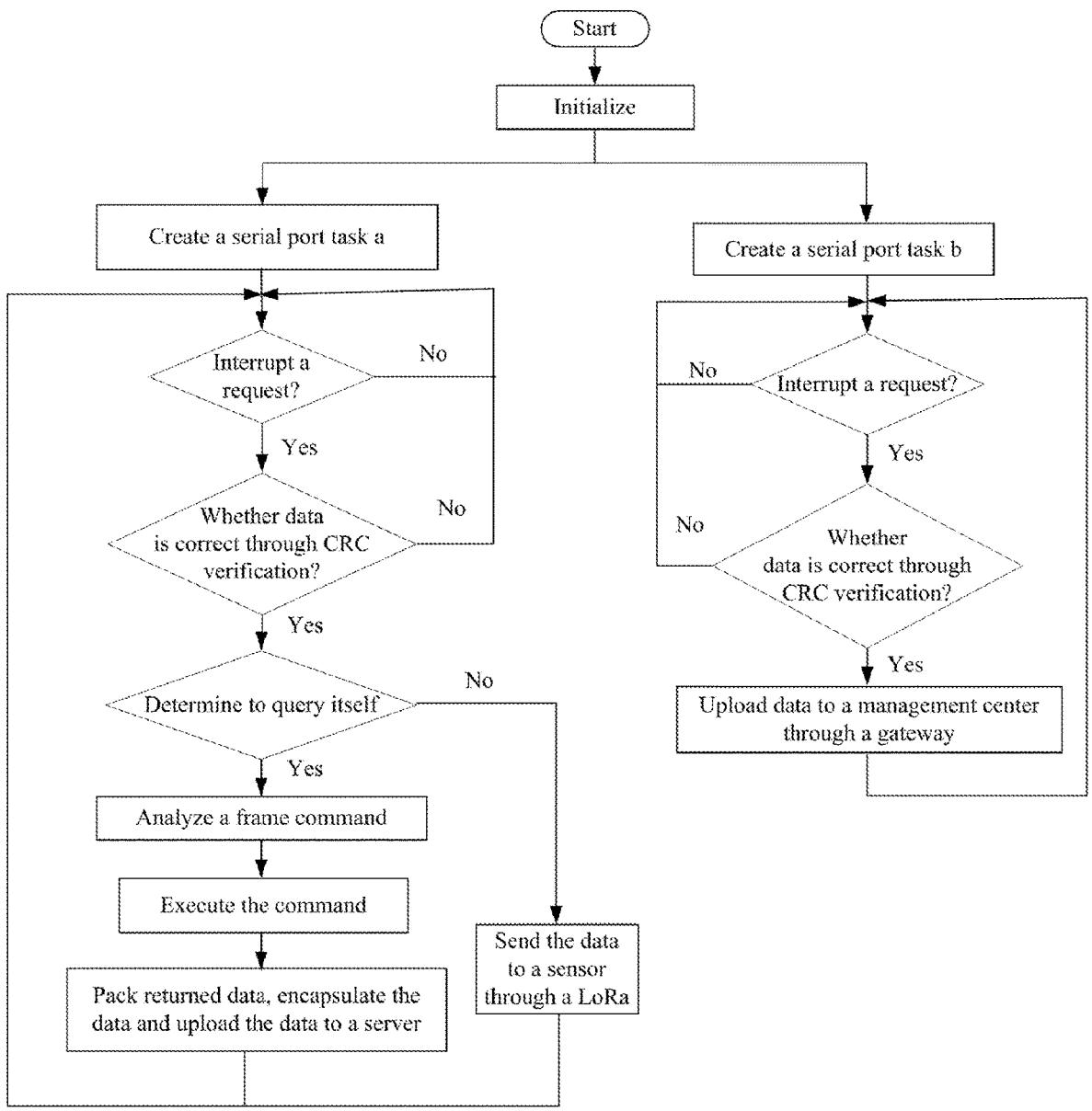
FIG. 5 is a flow chart of software design according to some embodiments of the present disclosure.

The gateway is communicated with the LoRa wireless network and the server, with the flow chart of software design as shown in FIG. 5. Upon reception of a message from a centralized management center or a message uploaded by an acquisition node, the sink node also performs CRC verification on message data to ensure an accuracy of the data. Meanwhile, the sink node determines, according to a command in the message, whether the message is sent from a server or uploaded by the perception terminal. If the message is sent from the server, the sink node determines, through a device number, whether the message is sent to itself or to the perception terminal; and if the message is uploaded by the perception terminal, and received data is correct through the CRC verification, the sink node uploads the data to the server.

In order to ensure the confidentiality and completeness of the data message, two secrete keys and two algorithms are used to protect the confidentiality and the completeness.

4) Centralized Control Unit

The centralized control unit can implement real-time and continuous online monitoring, and implement parallel and high-speed acquisition and processing for multiple paths of data with a structure of "an industrial control computer+a multi-path acquisition card". The excellent data processing capacity ensures the accuracy in data detection. With the anti-interference design of the system, the original detection data are subjected to four stages of processing, namely hardware filtration, software filtration, feature extraction, and preliminary diagnosis, thereby effectively removing external interference signals.

The centralized control unit includes: a power management module, an analog signal conditioner module, and a data analysis and management module.

(2) Network Layer

The network layer uses LoRa communication to improve a communication reliability of a sensor and an intelligent level of the system.

(3) Diagnostic Layer

The diagnostic layer is provided at a substation server, and can acquire the monitored data and a preliminary analysis result from the perception layer in real time; manage basic information of a tested OLTC device; provide a parameter for edge computing of the perception layer; receive the monitored data from the perception layer; analyze and display a monitoring state and an advanced analysis result of the tested device in real time; perform fault data analysis, original graph analysis, envelope analysis, and energy spectrum analysis on the specific monitored data; generate and manage a case library; generate and manage a standard library; generate a report, etc.

The above are only specific implementations of the present disclosure, but the protection scope of the present disclosure is not limited thereto. Any change or replacement that may be conceived without creative effects should fall within the protection scope of the present disclosure. Therefore, the protection scope of the present disclosure should be subject to the protection scope defined by the claims.

The invention claimed is:

1. A system for perceiving an operating state of a large power transformer based on vibro-acoustic integration, comprising: a perception layer, a network layer and a diagnostic layer, wherein the perception layer is used for monitoring, in real time, a state parameter for a coupling vibration signal and an acoustic signal of each of a transformer core, a winding, a clamp and a housing, a state parameter of each of a vibration signal and an acoustic signal during a gear position change of an on-load tap changer (OLTC), and preliminarily diagnosing and analyzing monitored data;

the network layer is used for reliably transmitting a monitoring signal to a background;

the diagnostic layer is used for managing basic information of a tested OLTC device; configuring a parameter for analysis of the perception layer; receiving the monitored data from the perception layer; analyzing and displaying a monitoring state and an advanced intelligent analysis result of the tested device in real time; performing fault data analysis, original graph analysis, envelope analysis, and energy spectrum analysis on the specific monitored data; generating and managing a case library; generating and managing a standard library; generating a report; receiving and managing basic device information and a tested device state from a data access node; alarming for an abnormal state and prompting a user; and counting and analyzing a fault gear position distribution, a fault type distribution and the like for the tested device state; and wherein the perception layer is provided with two perception terminals, used for respectively acquiring a vibration signal and a voiceprint signal, and wirelessly transmitting the vibration signal and the voiceprint signal to a centralized control unit, a sensor, a data acquisition plate, a wireless module, and a battery being integrated into each of the perception terminals, wherein a microprocessor control unit (MCU) module as a master control chip is used for configuring a sensor unit and a communication unit, acquiring and processing information of the sensor, and sending the information to the communication unit; the sensor unit is used for perceiving and acquiring environmental information; the communication unit is used for receiving and modulating a signal from the MCU or demodulating a signal from an antenna; the antenna is used for transmitting and receiving a signal; a vibro-acoustic signal passes through a micropower crystal amplifier from the sensor to an ultra-low-power voltage comparator; and when the vibro-acoustic signal reaches a limit value, a field effect transistor (FET) is activated.

2. The system for perceiving an operating state of a large power transformer based on vibro-acoustic integration according to claim 1, wherein upon reception of a command from a sink node, the perception terminals each perform cyclic redundancy check (CRC)16 verification on data to ensure an accuracy of the data, execute a corresponding operation according to a frame command in a message, and then upload corresponding data information to a gateway.

3. The system for perceiving an operating state of a large power transformer based on vibro-acoustic integration according to claim 1, wherein the perception terminals each are further provided with software; the perception terminals each not only acquire data, but also upload and receive data and a command through a long range radio (LoRa) network; upon reception of a message from a centralized management center or a message uploaded by an acquisition node, a sink node also performs CRC verification on message data to ensure an accuracy of the data, and determines, through a command in the message, whether the message is sent by a server or uploaded by the perception terminal; if the message is sent by the server, the sink node determines, through a device number, whether the message is sent to itself or to the perception terminal; and if the message is uploaded by the perception terminal, and received data is correct through the CRC verification, the sink node uploads the data to the server.

4. The system for perceiving an operating state of a large power transformer based on vibro-acoustic integration according to claim 1, wherein the perception layer further comprises a centralized control unit, used for implementing real-time and continuous online monitoring with an industrial control computer and a multi-path acquisition card.

5. The system for perceiving an operating state of a large power transformer based on vibro-acoustic integration according to claim 1, wherein the network layer uses LoRa communication to improve a communication reliability of a sensor and an intelligent level of the system.

6. The system for perceiving an operating state of a large power transformer based on vibro-acoustic integration according to claim 1, wherein the diagnostic layer is provided at a substation server, and used for acquiring the monitored data and a preliminary analysis result from the perception layer.

\* \* \* \* \*